| United States Patent [19] | [11] Patent Number: 4,887,051 |
| McCutcheon | [45] Date of Patent: Dec. 12, 1989 |

[54] LOW PHASE JITTER OSCILLATOR

[75] Inventor: Samuel McCutcheon, Coronado, Calif.

[73] Assignee: Autek Systems Corporation, San Jose, Calif.

[21] Appl. No.: 299,398

[22] Filed: Jan. 23, 1989

[51] Int. Cl.⁴ .............................................. H03B 1/00
[52] U.S. Cl. .............................. 331/69; 331/DIG. 3
[58] Field of Search .......... 331/66, 69, 177 R, DIG. 3

[56] References Cited
FOREIGN PATENT DOCUMENTS 1570207 6/1980 United Kingdom ......... 331/DIG. 3

Primary Examiner—Eugene R. LaRoche
Assistant Examiner—Robert J. Pascal
Attorney, Agent, or Firm—Blakely Sokoloff Taylor & Zafman

[57] ABSTRACT

A low phase jitter oscillator which is adjustable in frequency is disclosed. The oscillator comprises a logical OR gate having a feedback loop adjustable in length between the inverted output of the gate and the input of the gate. Using this configuration, the output changes state once every ½ T seconds wherein ½ T is equal to the propagation delay through the feedback loop and the OR gate. The frequency of the oscillator can be adjusted by adjusting the length of the feedback loop which correspondingly modifies the propagation delay through the feedback loop and thus the frequency of the oscillator output.

16 Claims, 5 Drawing Sheets

LOW PHASE JITTER OSCILLATOR

BACKGROUND OF THE INVENTION

1. Field of the Invention:

The field of the invention is related to oscillators or clock circuits specifically the field of the invention is low phase jitter clock circuits.

2. Art Background:

Clock generators are typically used to synthesize delay times in delay generators, and to produce other related frequencies in frequency synthesizers. A clock generator produces a stream of pulses which are equally spaced in time. Generally, crystal oscillators are used for these clock generators due to their accuracy and simplicity. However, crystal oscillators are very hard to synchronize with an external triggering event. When a delay needs to be synchronized when an external trigger pulse, the need for coherence between the clocks is important.

If there is no coherence between the trigger initiating a delay and the clock whose cycles are counted to synthezise a delay, the resulting delay will be in error by as much as one clock cycle time. If the trigger pulse, by some fortunate accident, happens to be exactly coincident with one pulse in the clock generator, there will be no error in generating the proper delay time. However, this is seldom the case and generally the trigger, which is an independent event, will fall somewhere between two pulses of the clock generator. The time from the trigger pulse to the next clock pulse is unwanted and is called jitter. Jitter is thus a random variation in the desired delay time.

It is desirable to have an accurate clock which is coherent with the trigger pulse. It is also desirable to be able to adjust the frequency of the clock by a simple and stable means.

SUMMARY OF THE INVENTION

It is therefore an object of the invention to provide an oscillating circuit having low phase jitter relative to an independent trigger pulse. It is also an object of the present invention to provide a single circuit that can be easily adapted and adjusted to different oscillating frequencies.

This is accomplished by utilizing a logical NOR gate having a feedback loop adjustable in length between the inverted output of the gate and the input to the gate. Using this configuration, the output changes state once every $\frac{1}{2}T$ seconds wherein $\frac{1}{2}T$ is equal to the propagation delay through the feedback loop and the NOR gate. The frequency of the oscillator circuit can be adjusted by adjusting the length of the feedback loop which correspondingly modifies the propagation delay through the feedback loop and thus the frequency of the oscillator output.

BRIEF DESCRIPTION OF THE DRAWINGS

The objects, features and advantages of the low jitter oscillator of the present invention will be apparent from the following detailed description on which.

DETAILED DESCRIPTION OF THE INVENTION

Figure 1:
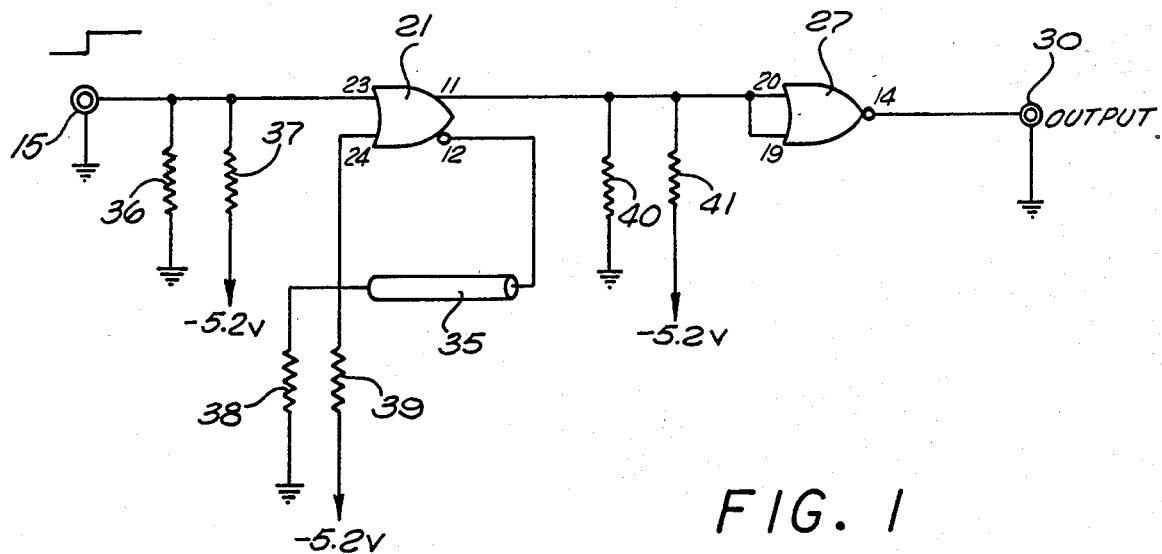
FIG. 1 illustrates the circuitry of the oscillator circuit of the present invention.

Referring to FIG. 1 the oscillator circuit of the present invention comprises a gate input 15, OR gate 21, NOR gate 27 and resistor pairs 36–37, 38–39, 40–41. To initiate the oscillator circuit, a trigger is input to the circuit, illustrated in FIG. 1 by gate input 15. In the present illustration, the input to the circuit is normally high and the circuit is triggered by a change in the input to a low state.

OR gate 21 comprises first and second input pins 23 and 24, output pin 11 and inverted output pin 12. The gate input 15 is input to OR gate 21 at a first input pin 23. The signal output from inverted output pin 12 is input to a second input pin 24 through feedback loop 35. The feedback loop 35 is a predetermined length to cause a predetermined propagation delay betwen the output of the signal from output pin 12 and the input of the signal to the second input pin 24. The length of the feedback loop is adjusted to a length such that the sum of the propagation delay through OR gate 21 and the propagation delay through feedback loop 35 is equal to one-half the desired period of the signal output from the oscillator circuit which produces an oscillating signal having a period T or frequency 1/T. The signal output from OR gate 21 through output pin 11 is transmitted to NOR gate 27 which functions to isolate the signal from pin 11 to output 30. The output signal from NOR gate 27 is subsequently output through output pin 14 to output port 30 of the circuit. Output port 30 may be connected to another circuit or device to provide an oscillating signal input to that circuit or device.

In the initial state, the gate input signal is a high state, the inverted output signal through inverted output pin 12 is in a low state and the signal input 15 changes to a low state the signal output from output pin 11 changes to a low state and the signal output from inverted output pin 12 changes to a high state. After a delay equal to the propagation delay of feedback loop 35, the signal input to second input pin 24 changes to a high state, which causes the signal output through output pin 11 to change to a high state and the signal output through inverted output pin 12 to change to a low state. Similarly, after a delay equal to the propagation delay of feedback loop 35, the signal input to the second input pin 24 changes again to a low state, causing the signal output from output pin 11 to change to a low state and the signal output from inverted output pin 12 to change to a high state.

The sequence of inputting the inverted signal output throught inverted output pin 12 to input pin 24 through feedback loop 35 is repeated over and over to produce an oscillating signal having a period T at output port 30:

$$T = 2(Pd_g + Pd_{fl})$$

Where $P_{dg}$ is the propagation delay through the OR gate 21 and $Pd_{fl}$ is the propagation delay through the feedback loop 35. In as much the propagation delay through OR gate 21 is nominal and a constant, the propagation delay through feedback loop 35 and therefore the frequency of the oscillating signal is controlled by adjusting the length of the feedback loop 35.

Resistor pairs 36–37, 38–39, 40–41 in conjunction with ground and voltage sources function to properly terminate the input and output lines of OR gate 21. It is preferred that resistors 36, 38 and 40 have a value of 82 ohms and resistors 37, 39 and 41 have a value of 130 ohms the combination thereby effecting a uniform termination of 50 ohms.

Figure 3:
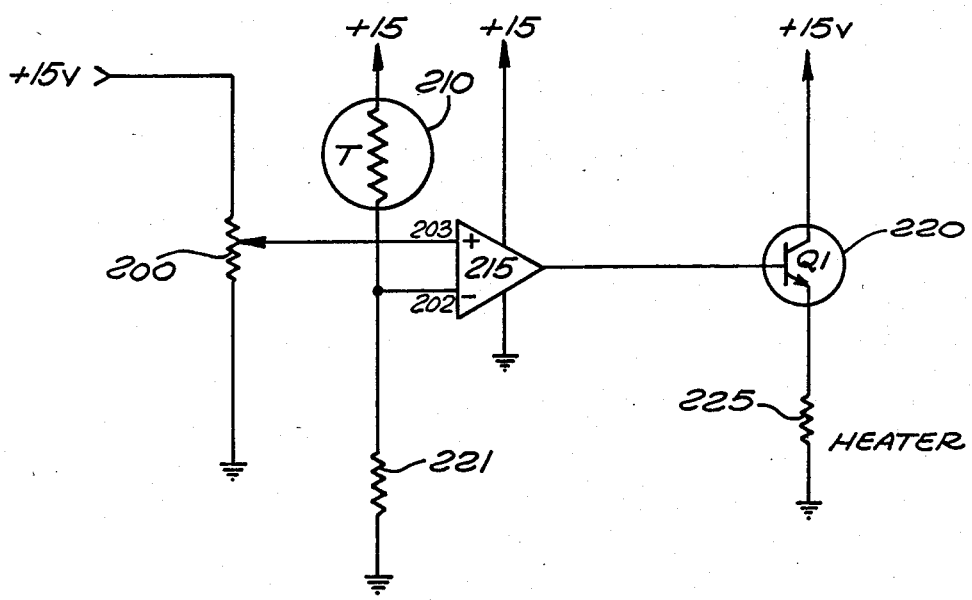
FIG. 3 illustrates the circuitry used to control the temperature in the area of the oscillator circuit of the present invention.
Figure 2:
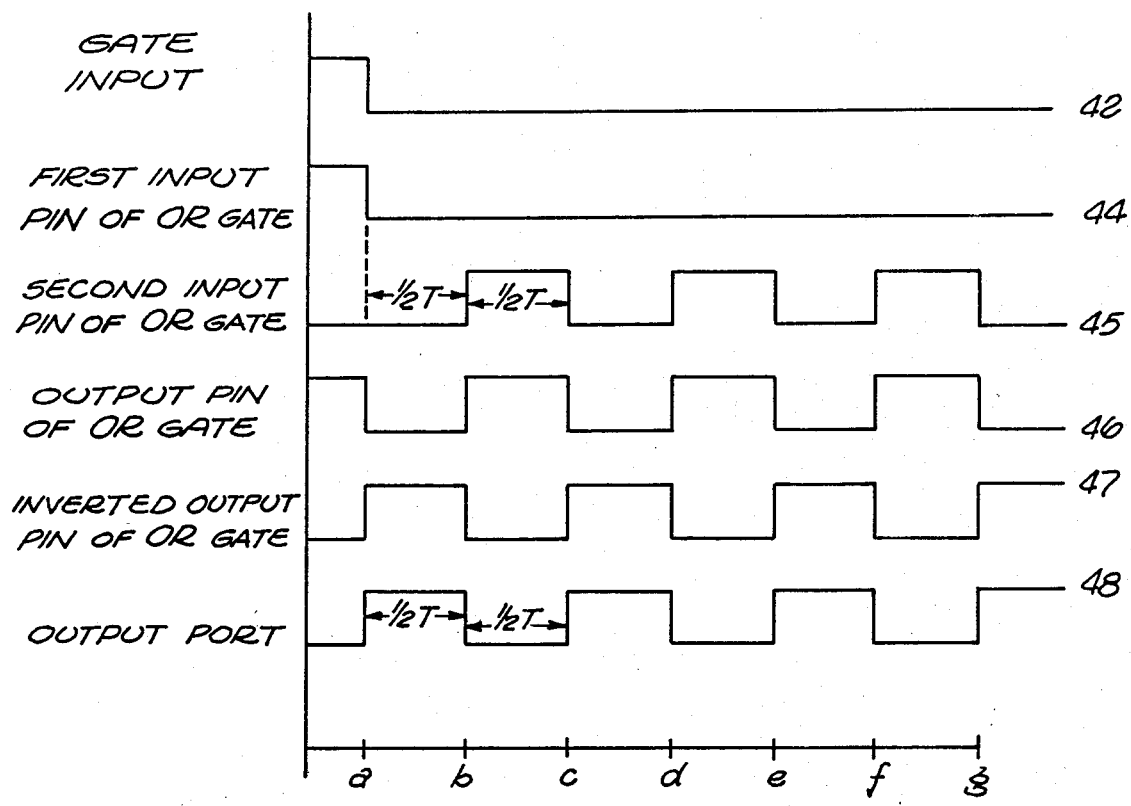
FIG. 2 illustrates the timing of the circuit illustrated in FIG. 1

The effect of the feedback loop on the output of the circuit is illustrated by the timing diagram shown in FIG. 2. The gate input signal 42 is normally high and changes to a low state to trigger the oscillator circuit of the present invention. The gate input signal is input to the first input pin 23 of the OR gate 21. Therefore, in the initial state, the signal input to the first input pin 23 is low, as shown in FIG. 3, signal 44. The signal input value at the second input pin 24 is low, illustrated in FIG. 2, signal 45, because the output signal from the inverted output pin 12, illustrated in FIG. 2, signal 47, is initially in a low state. The signal output at output pin 11, illustrated in FIG. 2 as signal 46, is equal to the OR function performed on the signals received at first and second input pins 23 and 24. Thus the signal 46 output from output pin 11 is in a high state because the signal 44 input to the OR gate 21 at input pin 23 is in a high state. The signal 46 is then input to NOR gate 27 which inverts the signal, illustrated in FIG. 2, signal 48, and the inverted signal 48 is output to output port 30.

At time "a" the gate input changes from a high state to a low state. Thus, the signal 44 input to OR gate 21 through input pin 23 changes to a low state. However, the signal 45 input to the OR gate through the second input pin 24 remains in a low state because the signal 46 output from inverted output 12 has not changed. The signal 46 output from output pin 11 changes to a low state in response to the change of signal 44 because the two input signals 44, 45 to OR gate 21 are now both in a low state. Similarly, the inverted output signal 46 changes from a low to a high state in response to the change of signal 44. Therefore, at a later time equal to the propagation delay of feedback loop 35, designated in FIG. 2 as "b", the signal 45, input to OR gate 21 through the second input pin 24, changes to a high state, causing the output signals 46, 47 from OR gate 21, the output signal from NOR gate 27 and the signal 48 output through output port 30 to change state. Again, at a later time corresponding to the propagation delay of feedback loop 35, designated in FIG. 2 as "c", the signal 45 changes state causing the output signals 46, 47 from OR gate 21, the output signal from NOR gate 27 and the signal 48 output through output port 30 to change state. This process continues indefinitely, producing an oscillating signal output at output port 30 until the gate input is again set to the high state which immediately stops the oscillating signal output and brings the circuit back to its initial state.

As is evident from the above description, the initiation of the oscillating signal is dependent upon the trigger signal and the oscillating signal output generated operates approximately in phase with the trigger signal with low phase jitter because the delay between the trigger signal and the beginning of the oscillating signal output is caused soley by the propagation delay through the OR gate 21 and NOR gate 27, a delay which is minimal. In addition, by eliminating the need for a crystal oscillator, the oscillator circuit of the present invention does not have jitter caused by the necessity of a "warm up" period which is required for a crystal oscillator. It is also evident that the oscillator circuit of the present invention offers a simple, unique way to adjust the frequency of the oscillating signal output by adjusting the length of feedback loop 35. Through this method fine tuning adjusments of the frequency of the oscillating signal can be easily performed and the complexity due to the addition of components to modify the frequency of the oscillating output is avoided.

The accuracy and timing response of a digital circuit changes according to the temperature of the surrounding environment. Therefore in order to insure that the integrity of the oscillator output, is maintained, it is desirable to maintain the environment of the circuitry, particularly OR gate 21, at a constant temperature. This may be achieved using the simple heating circuit illustrated in FIG. 3. The heating element itself is a large resistor preferably of the magnitude of 62 ohms which generates an amount of heat proportional to the current flowing through the resister. This heater is placed in close proximity to the OR gate 21 and NOR gate 27 so as to maintain those elements at a constant temperature. The circuit for realizing this function, illustrated in FIG. 3, comprises thermistor 210, variable resistor 200, resistor 221, differential amplifier 215, transistor 220 and heater 225.

Thermistor 210 functions as a variable resistor wherein the resistance of the thermistor varies as the temperature of the environment it senses varies. The resistance value of the thermistor affects the voltage level input to negative input 202 of differential amplifier 215. For example, as the temperature increases in the environment the thermistor 210 senses, the resistance value of the thermistor increases, causing a greater voltage drop across the thermistor and decreasing the voltage level at the negative input 220 of differential amplifier 215. The variable resistor 200 is adjusted to affect a certain voltage level at the positive input 203 of differential amplifier 215 that is the equivalent to the voltage level which would appear at negative input 202 of differential amplifier 215 when the thermistor senses a predetermined minimum temperature in the environment. Thus, if the temperature sensed by the thermistor 210 is below the minimum temperature value, the output of the differential amplifier 215 drives transistor 220 which in turn provides the connection to power heater 225. This heater 225 will continue to operate until the thermistor senses a temperature less than or equal to the minimum temperature value at which time the output of the differential amplifier no longer drives the transistor 220 thereby disconnecting the power to heater 225.

Figure 4:
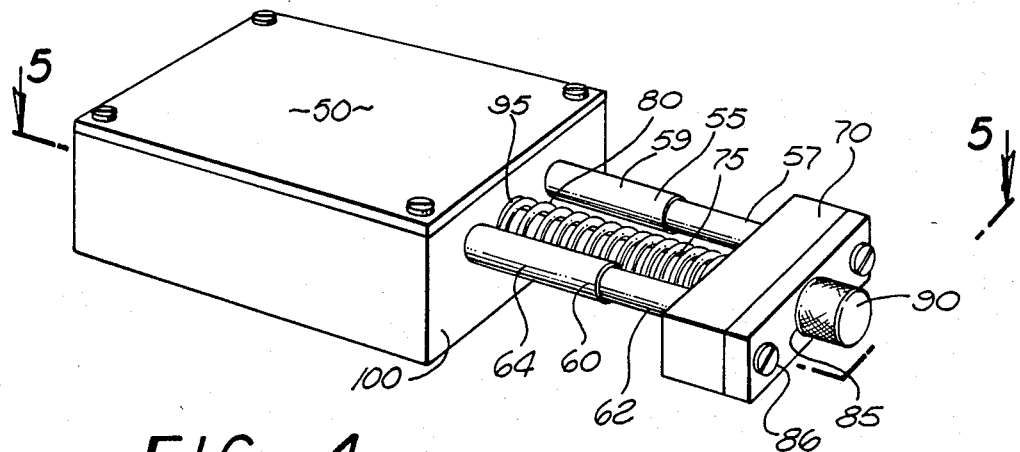
FIG. 4 illustrates a preferred embodiment of the present invention.
Figure 5:
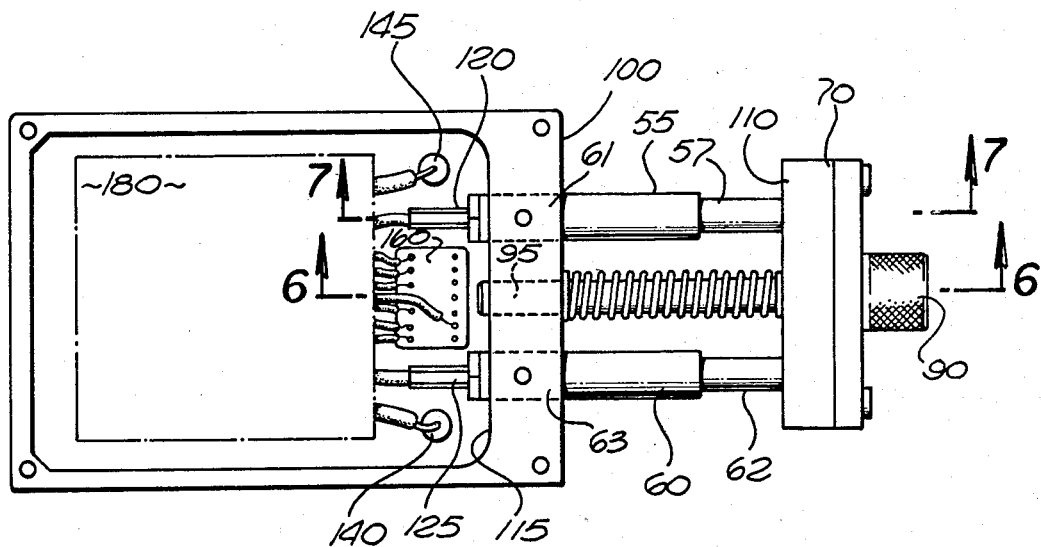
FIG. 5 is a cutaway view of the preferred embodiment of the present invention illustrated in FIG. 1.
Figure 6:
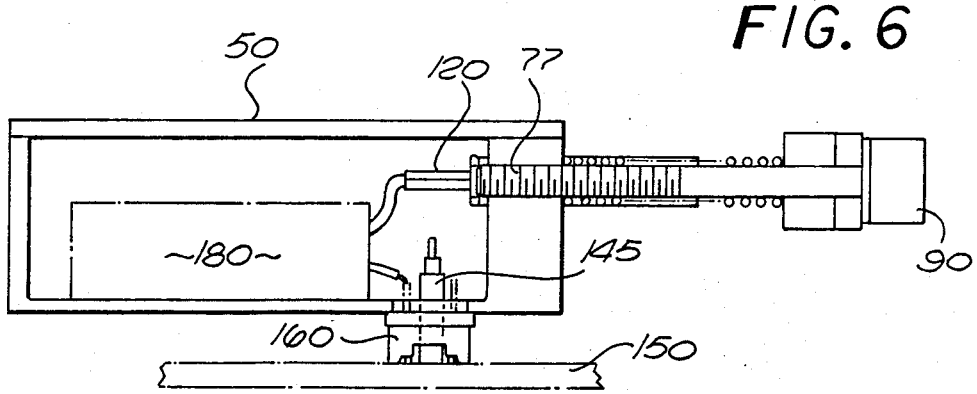
FIG. 6 is a side cutaway view of the preferred embodiment depicted in FIG. 1.

One embodiment of the oscillator circuit of the present invention is illustrated in FIGS. 4-9. Referring to FIG. 4 the oscillator shown comprises a housing 50 having circuitry 180 inside the housing and two coaxial tubular members 55 and 60, which are attached to the housing and form the adjustable feedback loop of the oscillator of the present invention. Each tubular member 55, 60 comprises an inner tubular sleeve 57, 62 and outer tubular sleeve 59, 64 which are slidably connected to each other to permit the adjustment of the length of the tubular members 55, 60. The tubular members 55, 60 are adjustable in length by moving the inner sleeve 57 and 62 from the outer sleeves 59, 64.

Figure 7:
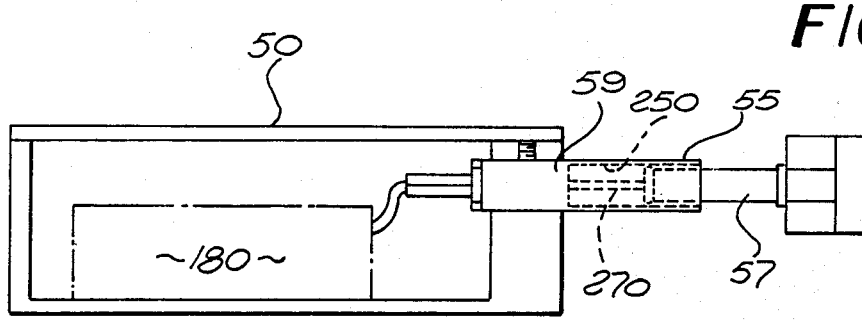
FIG. 7 is a cutaway view of the preferred embodiment of the present invention.
Figure 8:
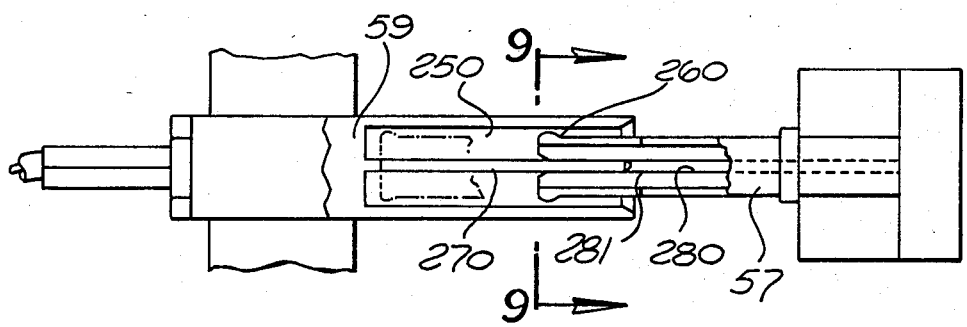
FIG. 8 is a side partial cutaway view showing the part of the feedback loop used to control the frequency of the oscillator of the present invention.
Figure 9:
FIG. 9 is another side cutaway view of the coaxial connector shown in FIG. 5 which functions as part of the feedback loop in the oscillator of the present invention.

Referring to FIGS. 7-9, the inside surface of the outer sleeve 64 has a diameter slightly larger than the diameter of the outside surface of the inner sleeve 62 such that when the inner sleeve 62 is inserted into the outer sleeve 64 the outside surface of the inner sleeve 62 physically and electrically mates with the inside surface of the outer sleeve 64. This is illustrated in FIG. 8. The inside surface of the outer sleeve 64 identified as 250, physically and electrically mates with a portion 260 of the outside surface of inner sleeve 62. Preferably the outer sleeve is constructed out of brass.

Outer sleeve 64 further comprises a pin shaped signal conductor 270 which is concentrically aligned in the center of outer sleeve 64 and extends from approximately the edge of the outside sleeve 64 to where the outer sleeve 64 is connected to terminal lead 120 in housing 50. The pin 270 is electrically isolated from the surfaces. The pin 270 is the conductor which forms the feedback loop portion through outer sleeve 64. The pin is preferably sturdy enough so that the pin will concentrically mate with inner sleeve 62 thereby providing a continuous electrical connection between inner sleeve 62 and outer sleeve 64. Most preferably the sleeve is made out of Beryllium copper although any sturdy conductive material may be used.

The inner sleeve 62 further comprises a conductive aperture 280 which operates as the signal conductor and is concentrically aligned in the inner sleeve, the conductive aperture being electrically and physically isolated from the inside surface 281 of inner sleeve 62. The conductive aperture 280 is the conductor inside the inner sleeve which forms a portion of the adjustable feedback loop of the oscillator of the present invention. Preferably a form of an insulator 285 such as non-conductive plastic is used to isolate inside surface 281 of inner sleeve 62 from the conductive aperture 280. The diameter of the aperture 280 is slightly larger than the diameter of pin shaped conductor 270 and the conductive aperture is aligned such that when the inner sleeve is inserted into the outer sleeve the pin 270 electrically and physically mates with the conductive aperture 280, thereby providing a connection between the inner sleeve and outer sleeve. The conductive aperture 280 extends the length of the inner sleeve 62 and is preferably constructed of a conductive material such as Beryllium copper.

Outer sleeves 59, 64 are attached to housing 50 through apertures 61 and 63 and extend into the interior of housing 50. The tubular inner sleeves 57 and 62 are attached to rectangular block 70 which fixes the alignment of the inner sleeves with the outer sleeves 59, 64 attached to the housing 50 and further electrically connects the conductive apertures 280 of inner sleeves 57 and 62. The rectangular block 70 also functions to control the length of the coaxial tubular members 55 and 60 in conjunction with a screw bolt 75 having a head 90 at one end and a threaded portion 77 at the opposite end and spring 80. The screw bolt 75 is inserted through the rectangular block 70 through an aperture 85 wherein the head of the screw bolt 90 abuts the surface 85 of the rectangular block 70. The threaded portion 77 of the screw bolt 75 is inserted into housing 50 through threaded aperture 95, wherein the aperture 95 threadedly connects with screw bolt 75. The head 90 of screw bolt 75 is grooved to produce a textured surface that makes it easier to manually turn the head to rotate the screw bolt into the threaded aperture. Spring 80 has a diameter slightly larger than the diameter of screw bolt 75 so as to slidably fit over screw bolt 75 such that the spring 80 surrounds screw 75 and is located between the surface 100 of housing 50 and the surface 110 of rectangular block 70. The spring is biased such that it functions to apply pressure against surface 110 of rectangular block 70 forcing the rectangular block and the inner sleeve 57, 62 attached thereto, away from the surface 100 of the housing 50 and external sleeves 59 and 64 attached to the housing 50. Thus the force applied by spring 80 against the surface 110 of rectangular block 70 causes the tubular members 55, 60 formed by the connection of the inner and outer sleeves, respectively 57, 59 and 62, 64, to be lengthened. The amount or the distance that the spring 80 pushes the surface 110 of rectangular block 70 is controlled by the screw bolt 75. The grooved head 90 of the screw bolt 75 may be rotated in a clockwise rotation to cause the screw bolt 75 to travel deeper into threaded aperture 95 brining the rectangular block 70 closer to the surface 100 of the housing which causes the inner sleeves 57, 62 to slide further into outer sleeves 59, 64 thereby decreasing the total distance of the tubular members 55 and 60 which decreases the length of the feedback loop and increases the frequency of the oscillating signal produced.

The leads 120, 125 extending from coaxial tubular members 60 and 55 from inside surface 115 of housing 50 connect the pin conductors 270 to the remaining circuitry 180 of the oscillator circuit thereby completing the connection of the feedback loop formed by coaxial tubular members 55, 60 and rectangular block 70. More particularly, the lead 120 of tubular member 55 extending from inside surface 115 may be connected to the input 24, illustrated in FIG. 1, of OR gate 21. Similary, the lead 125 of tubular member 60 extending from surface 115 may be connected to inverted output 11 of OR gate 21.

The input and output signals of the oscillaor circuit illustrated in FIG. 1, that is the gate input 15 and the signals output through output port 30 are connected to oscillator of the present invention through leads 140 and 145. Preferably, the gate is input to the oscillator circuit is input through lead 140 and the signal output through output port 30, is connected to output lead 145. Preferably, the gate is input to the oscillator circuit is input through lead 140 and the signal output through output port 30, is connected to output lead 145. Preferably the leads 140 and 145 are in the form of pins which mate to sockets located on the circuit board 150 thereby providing a physical attachment as well as a electrical connection in the circuit board from which the gate input originates and to which the oscillating signal is output. Preferably connector 160 is also utilized to provide additional connections that may be necessary between the oscillator and the circuit board such as ground and power inputs to drive the circuit. It is preferred that the connector 160 insertably attaches to a connector located on the circuit board 150 thereby providing an electrical connection and an additional physical connection between the oscillator and the circuit board to stabilize the physical connection of the device to the circuit board.

In operation, the oscillating frequency is adjusted by the screw bolt 75 which causes the coaxial tubular membranes 55, 60 to decrease the length or increase the length thereby increasing or decreasing the frequency of the oscillating signal. The frequency of the oscillator is given by the following equation:

$$F = \frac{1}{2(P_{dg} + P_{dfl})}$$

Where $P_{dg}$ is the propogation time of NOR gate 21 and $P_{dfl}$ is the total propogation time of the feedback loop 35.

It is preferred that the oscillating frequency is adjusted simply by placing a monitoring device at the output of the oscillator to monitor the frequency of the output and tightening or loosening the screw bolt 75 until the desired oscillating frequency is seen on the monitoring device.

Figure 10:
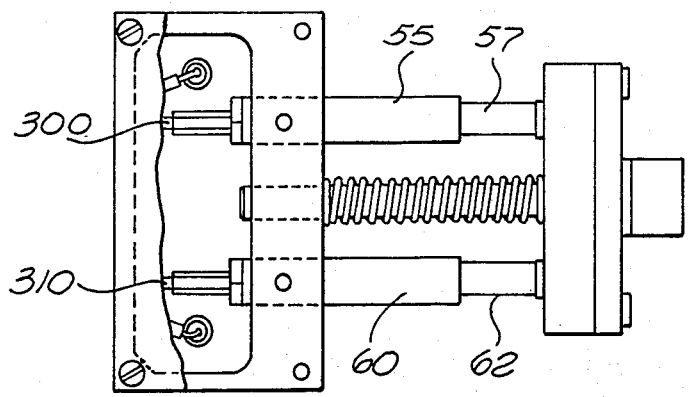
FIG. 10 is a partial top cutaway view of another embodiment of the oscillator of the present invention.
Figure 11:
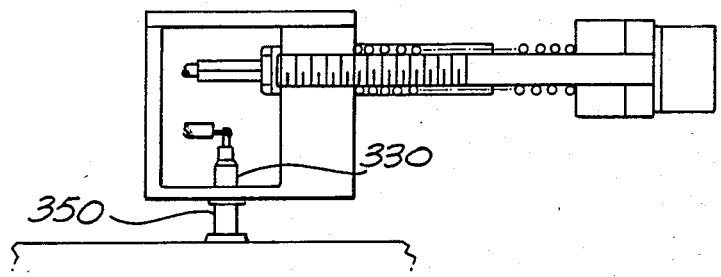
FIG. 11 is a side cutaway view of the embodiment illustrated in FIG. 9.
Figure 12:
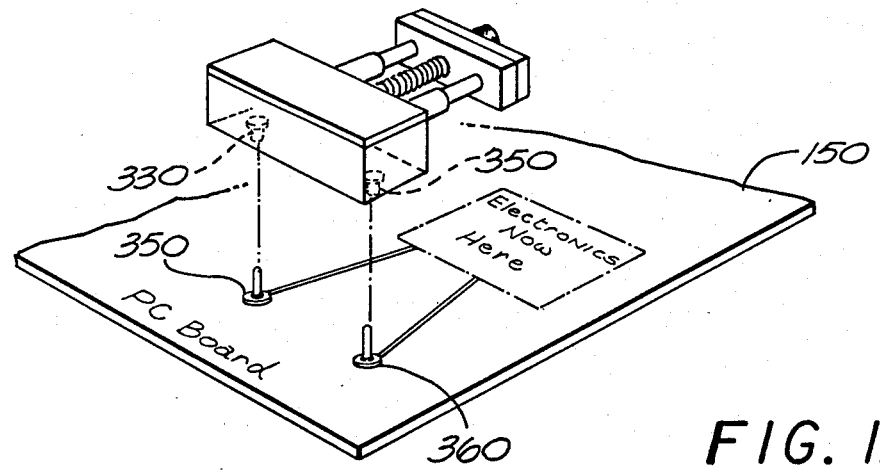
FIG. 12 illustrates the placement on a circuit board of the embodiment of the oscillator of the present invention.

Another embodiment of the oscillator of the present invention is illustrated in FIGS. 10-12. In this embodiment circuitry 180 is removed from the housing 50 and incorporated directly on the circuit board 150. The housing is reduced in size to eliminate the space previously needed to contain the circuitry 180. However the feedback loop mechanism, i.e. the tubular members 55, 60, screw bolt 75, spring 80 and rectangular block 79, is attached to the housing and functions in the same manner as described with respect to FIGS. 4-9. However, the output leads 300 and 310 from tubular condutor 60 and 55 are connected to conductive output pins 330 and 340. The conductive output which mate with pins 350, 360 on circuit board 150 to physically and electrically connect the adjustable feedback loop mechanism to the rest of the oscillator circuit located on circuit board 150. By incorporating part of the oscillator circuitry directly on the circuit board the construction cost of the oscillator can be reduced as well as the amount of board space required for placement of the oscillator.

The invention has been described in conjunction with the preferred embodiment. Numerous alternatives, modifications, variations and uses will be apparent to those skilled in the art in light of the foregoing description. For example, different circuit components which provide logical functions equivalent to those described herein may be used. In addition, the adjustment of the feedback loop need not only be embodied as the conductive tubular members described but, may also be embodied as a single conductor, such as an etched copper trace on the surface of a circuit board, with a moveable lead which may be adjusted along the length of the conductor in order to vary the actual operative length of the conductor feedback loop and therefore the propagation delay through the feedback loop which controls the frequency of the oscillating output.

What is claimed is:

1. A low phase jitter, adjustable oscillator wherein the delay between a trigger signal and an output oscillating signal generated therefrom is minimal, said oscillating signal oscillating between two states, said oscillator comprising:
    a gate input signal which acts as a trigger signal by changing from a first state to a second state;
    an OR-gate means, said OR-gate comprising an output pin, inverted output pin and first and second input pins, said OR-gate means outputting through the output pin and output signal which is the result of a logical OR function of the signals input to the first and second input pins and said OR-gate means outputting through the inverted output pin an inverted output signal which is the inverse of the signal output through the output pin, said gate input signal being connected to the first input pin and causing the output signal and inverted output signal to change state to initiate the output oscillating signal upon receipt of the trigger signal;
    a feedback loop means which connects said inverted output pin to the second input pin of the OR-gate, said feedback loop means being adjustable in length, wherein the inverted output signal is input to the OR-gate after a delay equal to the propagation delay through the feedback loop, causing the output signal and the inverted output signal to change state;
    wherein the output signal oscillates between states at a frequency equal to:

$$\frac{1}{2(Pdg + Pdfl)}$$

where Pdg is the propagation dealy of the OR-gate and Pdfl is the propagation delay of the feedback loop means, the propagation dealy of the feedback loop means being adjustable to varying lengths thereby modifying the propagation delay of the feedback loop means and the frequency of the oscillating output signal.

2. The oscillator of claim 1, further comprising a heater circuit to maintain the operating temperature of the OR gate means within a predetermined range.

3. The oscillator of claim 1, wherein the feedback loop means comprises a coaxial conductor.

4. the oscillator of claim 1, wherein the feedback loop means comprises a coaxial tubular member comprising an inner sleeve and outer sleeve which slidably connect with one another physically and electrically to carry an electrical signal from one end of the tubular conductor to the other end, the length of the coaxial tubular member being adjustable by slidably moving the inner and outer sleeve away or towards each other in order to respectively increase or decrease the length of the coaxial tubular member.

5. The oscillator of claim 4 wherein the feedback loop means further comprises a means to control the length of the coaxial tubular member.

6. The oscillator of claim 1, wherein the feedback loop means comprises two coaxial tubular members connected by a rectangular block shaped member, each coaxial tubular member comprising an inner sleeve and outer sleeve which slidably connect with one another physically and electrically to carry an electrical signal from one end of each tubular conductor to the other end, said coaxial tubular members being connected to the rectangular block shaped member, said rectangular block shaped member comprising a conductor which electrically connects the coaxial tubular members to form the feedback loop means, the length of the coaxial tubular member being adjustable by slidably moving the inner and outer sleeve away or towards each other in order to respectively increase or decrease the lengths of the coaxial tubular members.

7. The oscillator of claim 6 the feedback loop means further comprising a means to control the length of the coaxial tubular members.

8. The oscillator of claim 6 furhter comprising attachment means to mount the outer sleeves of the coaxial tubular members such that the inner sleeves slidably connect with the outer sleeves by the same amount whereby the coaxial tubular members are approximately the same length.

9. The oscillator of claim 6 further comprising means to control the length of the coaxial tubular members, said means comprising:
spring means to exert pressure against the rectangular block shaped means to force the rectangular shaped block means and the inner sleeves attached thereto away from the attachment means and the outer sleeves attached thereto;
control means that sets the distance the spring means forces the rectangular block means away from the attachment means.

10. The oscillator of claim 9 wherein the control means comprises a screw bolt connected at one end to the rectangular block means and threadedly connected to the attachment means at the other end, wherein the distance the spring means forces the rectangular block means away from the attachment means is determined by the amount the other end of the screw bolt threadedly connects the the attachment means.

11. the oscillator of claim 6 wherein the attachment means is a circuit board and the OR gate means is located on the circuit board.

12. The oscillator of claim 6 wherein the attachment means is a housing.

13. The oscillator of claim 12 wherein the OR gate means is located within the housing.

14. The oscillator of claim 12 wherein the housing is attached to a circuit board and the OR gate means is located on the circuit board.

15. A low jitter, adjustable oscillator wherein the delay between a trigger signal and an output oscillating signal generated therefrom is minimal, said oscillating signal oscillating between two states, said oscillator comprising:
a housing;
circuitry located within the housing, said circuitry comprising;
a means for receiving a gate input signal which acts a trigger signal by changing from a first state to a second state;
a means for outputting the oscillating signal output;
an OR-gate means, said OR-gate means comprising an output pin, inverted output pin and first and second input pins, said OR-gate means outputting through the output pin an output signal which is the result of a logical OR function of the signals input to the first and second input pins and said OR-gate means outputting through the inverted output pin an inverted output signal which is the inverse of the signal output through the output pin, said gate input signal being connected to the first input pin and causing the output signal and inverted output signal to change state to initiate the output oscillating signal upon reciept of the trigger signal;
a feedback loop means which connects said inverted output pin to the second input pin of the OR-gate, said feedback loop means comprising,
two coaxial tubular members, each coaxial tubular member comprising
an inner tubular sleeve and outer tubular sleeve which are slidably connected to each other,
wherein an inside surface of the outer sleeve has a diameter slightly larger than the diameter of an outside surface of the inner sleeve, said tubular conductors being adjustable in length by slidably moving the inner and outer sleeves,
each of said outer sleeves comprising a pin shaped signal conductor, having a diameter and concentrically aligned inside the center of the outer sleeve and electrically and physically isolated from the surfaces of the outer sleeve;
each of said inner sleeves comprising a conductive aperture signal conductor aligned inside the center of the inner sleeve and electrically and physically isolated from the surfaces of the inner sleeve, said aperture having a diameter which is slightly larger than the diameter of the pin conductor such that the pin conductor slidably mates electrically and physically with the conductive aperture when the inner sleeve and outer sleeve are slidably connected to form the coaxial tubular members;
said outer sleeves being attached to a first outside surface of the housing wherein one of said pin conductors electrically connects to the inverted output of the OR gate means and the other pin conductor of the OR gate means and the second input of the OR gate means of the circuitry;
a rectangular block having first and second surfaces, said inner sleeves being attached to the first surface of the rectangular block such that the distance between the inner sleeves is approximately the same as the distance between the outer sleeves, said rectangular block comprising an aperture and a signal conductor which electrically connects the conductive apertures of the inner sleeves;
a screw bolt having a head at a first end and a threaded portion at the opposite end, said screw bolt being inserted through the aperture of the rectangular block, said screw bolt extends from the first surface to the second surface and into a threaded aperture located on the first outside surface of the housing such that the second end of the screw bolt threadedly connects to the threaded aperture of the housing, said head of the screw bolt abutting the second surface of the rectangular block;
a spring having a diameter larger than that of the screw bolt, which slidably fits over the screw bolt between the first outside surface of the housing and the first outside surface of the rectangular block, said spring having a bias such that it functions to apply pressure against the first surface of the rectangular block to force the rectangular block and the inner sleeves attached thereto away from the first outside surface of the housing and the outer sleeves attached thereto, the distance the spring forces the rectangular block being controlled by rotating the screw bolt;

wherein the inverted output signal is input to the OR-gate after a delay equal to the propagation delay through the feedback loop causing the output signal and the inverted output signal to change state, said propagation delay being directly proportional to the length of the feedback loop means which is adjusted by rotating the screw bolt;

whereby the output signal oscillates between states at a frequency equal to:

$$\frac{1}{2(Pdg + Pdfl)}$$

where Pdg is the propagation delay of the OR-gate and Pdfl is the propagation delay of the feedback loop means, the propagation delay of the feedback loop means being adjustable to varying lengths thereby modifying the propagation delay of the feedback loop means and the frequency of the oscillating output signal 16. The oscillator of claim 14 further comprising a heater circuit located within the housing to maintain the operating temperature of the OR gate means within a predetermined range.

* * * * *

UNITED STATES PATENT AND TRADEMARK OFFICE
CERTIFICATE OF CORRECTION

PATENT NO. : 4,887,051

DATED : 12/12/89

INVENTOR(S) : McCutcheon

It is certified that error in the above-identified patent and that said Letters Patent is hereby corrected as shown below:

| | | |
|---|---|---|
| col. 01, line 19 | delete "when" | insert --with-- |
| col. 02, line 43 | delete "betwen" | insert --between-- |
| col. 02, line 59 | after "is" | insert --in-- |
| col. 02, line 61 | after "input" | insert-- at the second input pin 24 is in a low state. When the gate-- input signal |
| col. 03, line 09 | delete "throught" | insert --through-- |
| col. 04, line 13 | delete "soley" | insert --solely-- |
| col. 04, line 24 | delete "adjusments" | insert --adjustments-- |
| col. 06, line 07 | delete "85" | insert --86-- |
| col. 06, line 33 | delete "brining" | insert --bringing-- |
| col. 06, line 49 | delete "Similary" | insert --Similarly-- |
| col. 06, line 52 | delete "oscillaor" | insert --oscillator-- |
| col. 06, line 58-61 | delete "Preferably, the gate is input to the oscillator circuit is input through lead 140 and the signal output through output port 30, is connected to output lead 145." | |
| col. 07, line 39 | delete condutor | insert --conductor-- |

UNITED STATES PATENT AND TRADEMARK OFFICE
CERTIFICATE OF CORRECTION

PATENT NO. : 4,887,051

DATED : 12/12/89

INVENTOR(S) : McCutcheon

It is certified that error in the above-identified patent and that said Letters Patent is hereby corrected as shown below:

| | | |
|---|---|---|
| col. 08, line 32 | delete "dealy" | insert --delay-- |
| col. 08, line 34 | delete "dealy" | insert --delay-- |
| col. 08, line 44 | delete "the" (1st occurrence) | insert --The-- |
| col. 09, line 08 | delete "furhter" | insert --further-- |
| col. 09, line 67 | delete "reciept" | insert --receipt-- |
| col. 10, line 36 | delete "of the OR gate" | |
| col. 10, line 37 | delete "means and" | insert --electrically connects to-- |

Signed and Sealed this

Eighth Day of October, 1991

Attest:

HARRY F. MANBECK, JR.

*Attesting Officer*    Commissioner of Patents and Trademarks